US012142908B2

(12) United States Patent
Schulz et al.

(10) Patent No.: US 12,142,908 B2
(45) Date of Patent: Nov. 12, 2024

(54) FUSE AND PROTECTION CIRCUIT BASED UPON BIDIRECTIONAL SWITCH

(71) Applicant: Littelfuse, Inc., Chicago, IL (US)

(72) Inventors: Martin Schulz, Chicago, IL (US); Cesar Martinez, Chicago, IL (US); Liutauras Storasta, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 217 days.

(21) Appl. No.: 17/869,198

(22) Filed: Jul. 20, 2022

(65) Prior Publication Data

US 2023/0023713 A1 Jan. 26, 2023

Related U.S. Application Data

(60) Provisional application No. 63/224,713, filed on Jul. 22, 2021.

(51) Int. Cl.
*H02H 3/18* (2006.01)
*H02H 1/00* (2006.01)

(52) U.S. Cl.
CPC ............ *H02H 3/18* (2013.01); *H02H 1/0007* (2013.01)

(58) Field of Classification Search
CPC ........ H02H 3/18; H02H 1/0007; H02H 3/087; H02H 3/08; H03K 2217/0009; H03K 17/0828; H03K 17/08116; H03K 17/6874

(Continued)

(56) References Cited

U.S. PATENT DOCUMENTS

| 7,750,463 B2 * | 7/2010 | Osawa | H01L 25/072 257/723 |
| 2006/0167568 A1 * | 7/2006 | Jabaji | B60R 16/03 700/22 |

(Continued)

FOREIGN PATENT DOCUMENTS

| CN | 112930632 A | 6/2021 |
| WO | 2018046708 A1 | 3/2018 |

OTHER PUBLICATIONS

Naito, Takei, Nemoto, Hayashi and Ueno, "1200V reverse blocking IGBT with low loss for matrix converter," 2004 Proceedings of the 16th International Symposium on Power Semiconductor Devices and ICs, Kitakyushu, Japan, 2004, pp. 125-128, doi: 10.1109/WCT.2004.239842 (Year: 2004).*

(Continued)

*Primary Examiner* — Thienvu V Tran
*Assistant Examiner* — Sreeya Sreevatsa
(74) *Attorney, Agent, or Firm* — KDW Firm PLLC

(57) ABSTRACT

Circuitry and techniques for providing a bidirectional switch in devices for overcurrent protection and voltage protection are disclosed herein. In one embodiment, a circuit may include a first reverse-blocking insulating gate bipolar transistor (IGBT), having a first gate terminal, first collector terminal and a first emitter terminal. The circuit may include a second reverse-blocking IGBT, having a second gate terminal, a second collector terminal, electrically coupled to the first emitter terminal, and a second emitter terminal, electrically coupled to the first collector terminal. As such the first IGBT and the second IGBT may define a first current path, extending from the first collector to the second emitter; and a switch control circuit, coupled to send a control signal to at least one of: the first gate terminal and the second gate terminal, during an overcurrent event.

17 Claims, 5 Drawing Sheets

104

(58) Field of Classification Search
USPC .................................................... 361/84, 63
See application file for complete search history.

(56) References Cited

U.S. PATENT DOCUMENTS

| 2019/0206638 A1* | 7/2019 | Askan ...................... H02H 3/08 |
| 2020/0136604 A1 | 4/2020 | Schierling |
| 2022/0340020 A1* | 10/2022 | Papadopoulos ...... B60K 7/0007 |

OTHER PUBLICATIONS

D. Zhou, K. Sun, Z. Liu, L. Huang, K. Matsuse and K. Sasagawa, "A Novel Driving and Protection Circuit for Reverse-Blocking IGBT Used in Matrix Converter," in IEEE Transactions on Industry Applications, vol. 43, No. 1, pp. 3-13, Jan.-Feb. 2007, doi: 10.1109/TIA.2006.886422) (Year: 2007).*

Naito (Naito, Takei, Nemoto, Hayashi and Ueno, "1200V reverse blocking IGBT with low loss for matrix converter," 2004 Proceedings of the 16th International Symposium on Power Semiconductor Devices and ICs, Kitakyushu, Japan, 2004, pp. 125-128, doi: 10.1109/WCT.2004.239842) (Year: 2004).*

M. Takei, Y. Harada and K. Ueno, "600 V-IGBT with reverse blocking capability," Proceedings of the 13th International Symposium on Power Semiconductor Devices & ICs. IPSD '01 (IEEE Cat. No. 01CH37216), Osaka, Japan, 2001, pp. 413-416, doi: 10.1109/ISPSD.2001.934641 (Year: 2001).*

Daning Zhou et al., "An improved driving and protection circuit for reverse blocking IGBT," 2004 IEEE 35th Annual Power Electronics Specialists Conference (IEEE Cat. No. 04CH37551), 2004, pp. 118-124 vol. 1.

European Search Report and Written Opinion for the European Application No. EP22185053, mailed Dec. 7, 2022, 9 pages.

* cited by examiner

PROVIDE BIDIRECTIONAL SWITCH FORMED OF N PAIRS OF IGBTS IN ELECTRICAL SYSTEM OF VEHICLE POWERED BY HIGH VOLTAGE BATTERY
502

TRANSMIT FORWARD CURRENT OR REVERSE CURRENT IN VEHICLE ELECTRICAL SYSTEM THROUGH BIDIRECTIONAL SWITCH
504

DETECT OVERCURRENT CONDITION IN VEHICLE
506

SEND SIGNAL TO BIDIRECTIONAL SWITCH TO BLOCK CURRENT TRANSMISSION IN VEHICLE
508

FUSE AND PROTECTION CIRCUIT BASED UPON BIDIRECTIONAL SWITCH

RELATED APPLICATIONS

This application claims priority to U.S. provisional patent application Ser. No. 63/224,713, filed Jul. 22, 2021, entitled FUSE AND PROTECTION CIRCUIT BASED UPON BIDIRECTIONAL SWITCH, and incorporated by reference herein in its entirety.

FIELD OF THE INVENTION

The present disclosure relates to circuitry and techniques for providing overcurrent protection and voltage protection.

BACKGROUND

In the present day, the internal electric system of electric vehicles such as cars or trucks are powered by batteries that set a voltage in the range of hundreds of volts up to 1 kV or more. In order to limit current in the event of a fault, such vehicles are provided with a non-resettable fuse, such as a pyro fuse or melting fuse that limits current to a specified maximum value, above which value the fuse will open.

While such fuses may provide adequate protection of the electrical system of a vehicle, fuse replacement is required after a fault event.

It is with respect to these and other considerations that the present improvements may be useful.

BRIEF SUMMARY

In one embodiment, a bidirectional protection circuit may include a first reverse-blocking insulating gate bipolar transistor (IGBT), having a first gate terminal, first collector terminal and a first emitter terminal; a second reverse-blocking IGBT, having a second gate terminal, a second collector terminal, electrically coupled to the first emitter terminal, and a second emitter terminal, electrically coupled to the first collector terminal, wherein the first IGBT and the second IGBT define a first current path, extending from the first collector to the second emitter; and a switch control circuit, coupled to send a control signal to at least one of: the first gate terminal and the second gate terminal, during an overcurrent event.

In another embodiment, an electrical protection circuit for a vehicle is provided. The electrical protection circuit may include a bidirectional switch, comprising a first reverse-blocking IGBT and a second reverse-blocking IGBT, electrically coupled to the first reverse-blocking IGBT via a pair of emitter-to-collector connections; a current sense circuit, coupled to measure an internal current in an internal electrical system of the vehicle; and a logic circuit, coupled to receive a signal from the current sense circuit, and further including at least a gate driver circuit, coupled to a first gate of the first reverse-blocking IGBT and a second gate of the second reverse-blocking IGBT.

In a further embodiment a method may include: when a current level of electrical current through the electrical system is below a trip level, conducting a forward current and a reverse current through a bidirectional switch, determining a presence of an overcurrent condition when the trip level is reached, and sending a signal to block current transmission through the electrical system when the overcurrent condition is present.

BRIEF DESCRIPTION OF THE DRAWINGS

FIG. 5 shows an exemplary process flow.

DETAILED DESCRIPTION

Circuitry and techniques for providing overcurrent protection and voltage protection are disclosed herein. The circuits feature bidirectional switches, where these bidirectional switches may be formed from a pair of insulating gate bipolar transistors (IGBTs) according to some embodiments.

Figure 1:
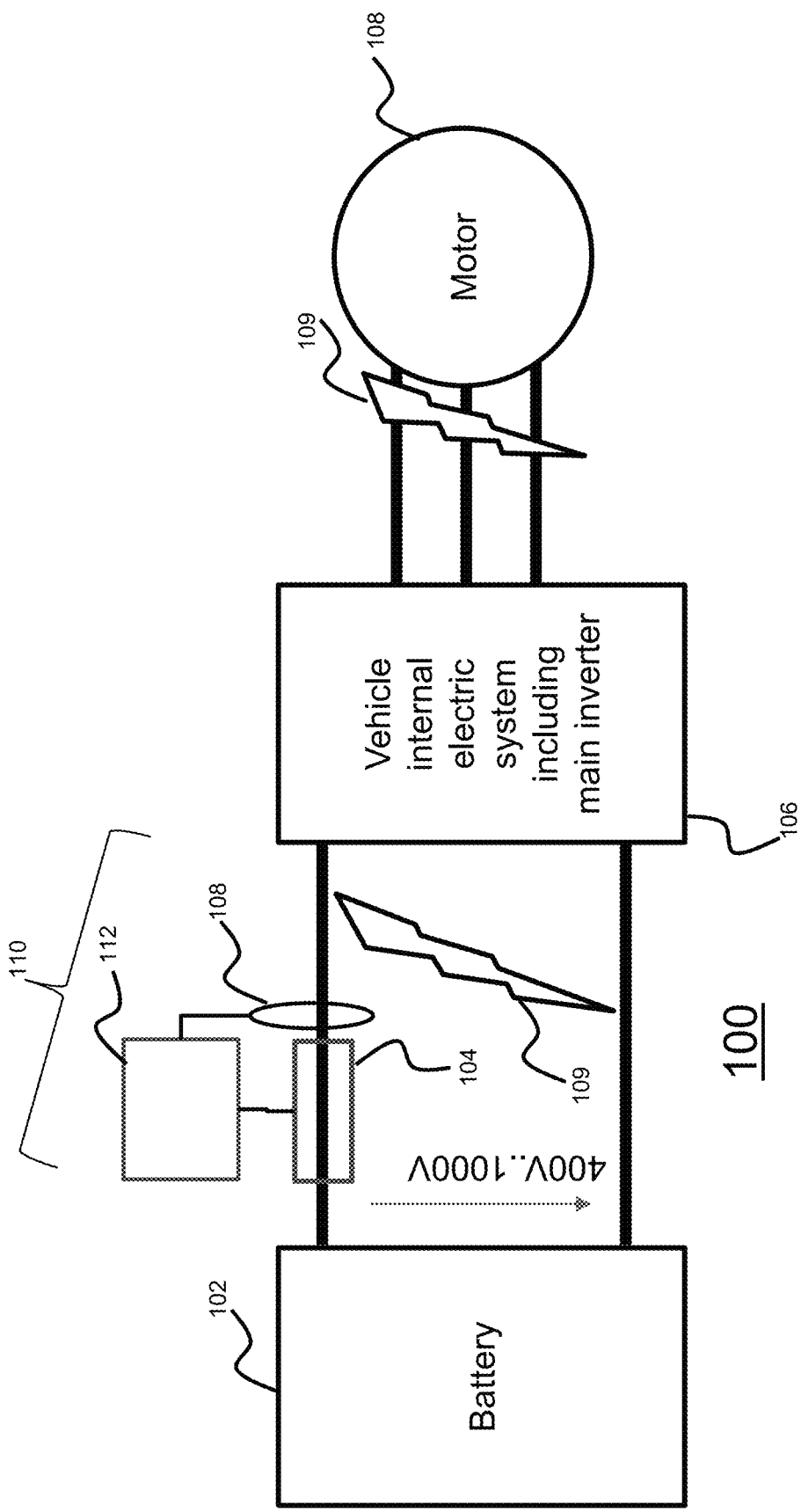
FIG. 1 is a representative drawing of an electrical protection circuit for providing bidirectional protection, according to exemplary embodiments.

FIG. 1 is a representative drawing of an electrical protection circuit 100 for providing bidirectional protection, according to exemplary embodiments. The electrical protection circuit 100 may include a bidirectional switch 104 and a protection circuit 110, including current sense circuit 108, coupled to measure an internal current in an internal electrical system 106 of a vehicle, and also including a logic circuit 112, coupled to receive a signal from the current sense circuit 108. The logic circuit 112 may include gate driver circuitry as well as microcontroller circuitry as shown. In the configuration of FIG. 1, the bidirectional switch 104 is positioned between a battery 102 and the internal electrical system 106.

As an example, in electric vehicles, the battery 102 may generate a voltage of between 400 V to 1000 V according to different non-limiting embodiments. As such, the bidirectional switch 104 may be arranged to establish or to interrupt an electrical connection between the battery 102 and the internal electrical system 106. During normal operation, the bidirectional switch 104 may be set to connect the battery 102 to the internal electrical system 106, where operating current of several hundred amps, even exceeding one thousand amps may be permitted to flow according to some non-limiting embodiments. During a fault condition 109, such as an overcurrent event caused by short-circuit during operation or maintenance, the bidirectional switch 104 may set to disrupt the connection between the battery 102 and the internal electrical system 106. Note that the fault condition 109 is shown as taking place in multiple locations, as in general a fault may present itself anywhere within the electrical system.

As illustrated in FIG. 1, the current sense circuit 108 may be coupled to measure the total DC-current provided to the vehicle, thus protecting the overall system from a central measurement. In the event of a fault, excess current that is above a threshold current may accordingly be detected by the current sense circuit 108.

In turn, the logic circuit 112 may be coupled to the current sense circuit 108 in order to receive a current sense signal generated by the current sense circuit 108, indicative of a fault or overcurrent event. Receipt of this signal from the current sense circuit 108 may trigger the logic circuit 112 to send a switch off signal to the bidirectional switch 104, in order to disrupt the connection between the battery 102 and the internal electrical system 106, and prevent damage to the internal electrical system 106.

Figure 2:
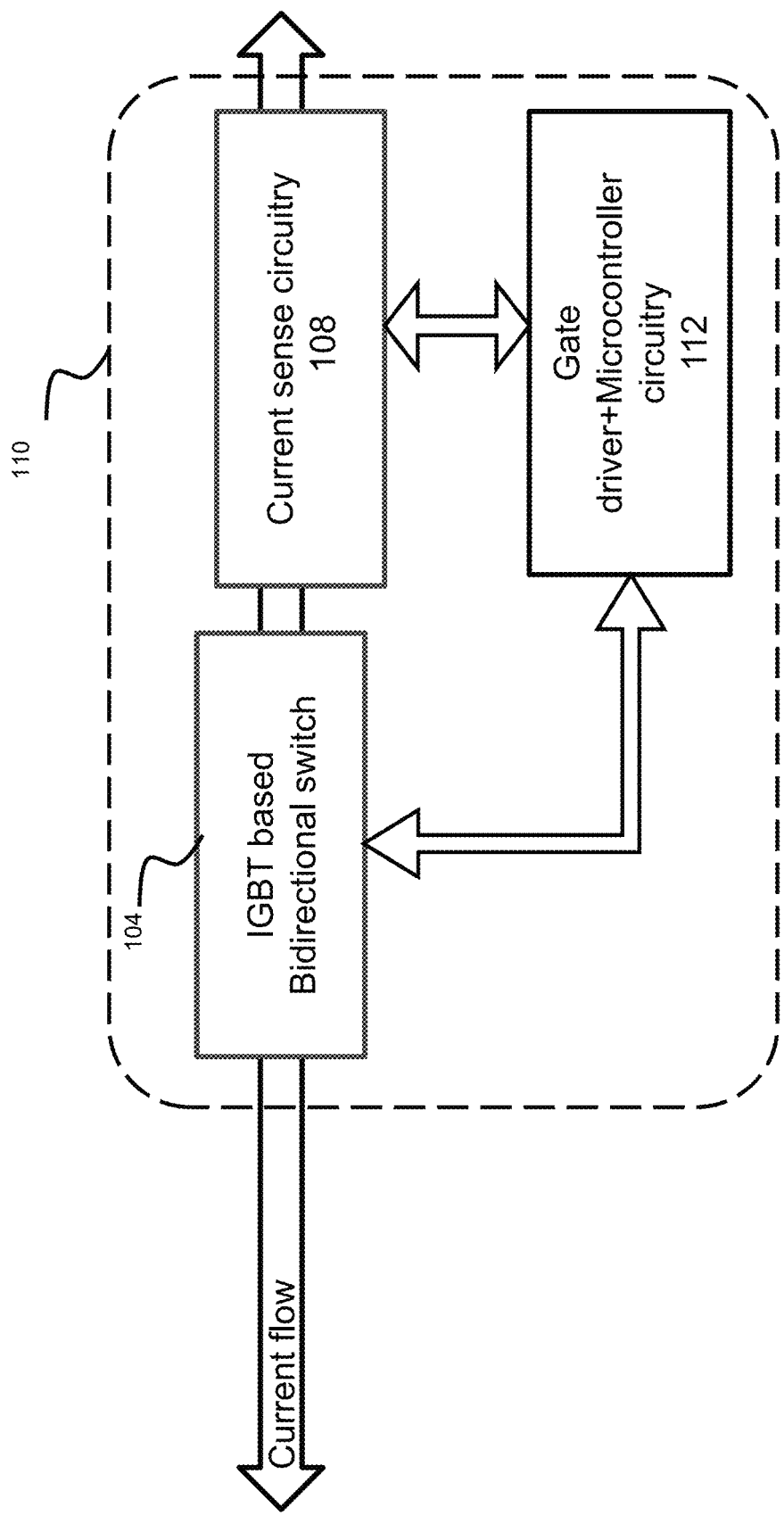
FIG. 2 presents details of one embodiment of a protection circuit.

FIG. 2 presents details of one embodiment of the protection circuit 110. In this example, the bidirectional switch 104 is embodied as an IGBT-based bidirectional switch, where details of such a switch are discussed below with respect to FIGS. 4A-4C. In brief, the bidirectional switch 104 may include n pairs of IGBTs, where each pair of IGBTs are arranged with a first IGBT and a second IGBT, electrically coupled to the first IGBT via a pair of emitter-to-collector connections. Advantageously, this configuration provides reverse voltage blocking capability in both directions, and the ability to conduct current in both directions. In addition, this configuration is capable of shutting off current, regardless of the direction of current flow. In some embodiments, each IGBT of a given IGBT pair that forms the bidirectional switch 104 may be implemented in a separate silicon die. One additional advantage of the configuration of a bidirectional switch formed from a first IGBT and a second IGBT, electrically coupled to the first IGBT via a pair of emitter-to-collector connections, is that, when operated, losses are minimized since the losses take place in a single semiconductor device or die. Note that the configuration of a reverse blocking IGBT has been recognized as inherently having lower dynamic performance than classical IGBT circuits without reverse blocking capabilities. However, the present inventors have recognized that in the implementation of the protection circuitry of FIGS. 1 and 2, for example, the dynamic performance will not matter, inasmuch as bidirectional fault protection will not demand superior dynamic performance.

Figure 3:
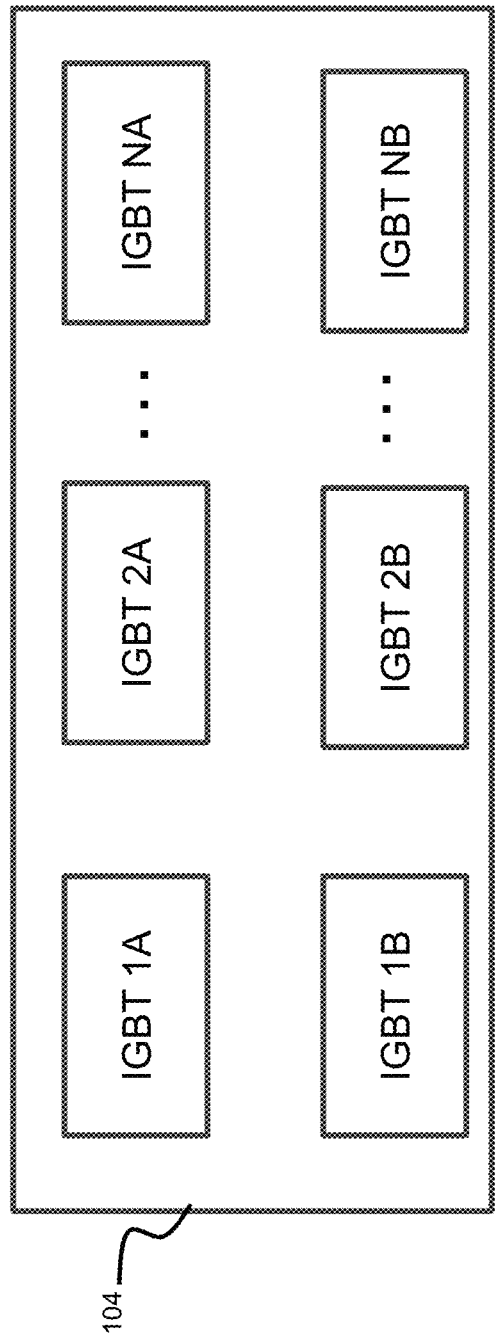
FIG. 3 shows the physical layout of one embodiment of a bidirectional switch.

FIG. 3 shows one embodiment of the bidirectional switch 104, where n pairs of IGBTs are arranged, for example, in separate semiconductor die, such as silicon die. Each IGBT pair (e.g. IGBT 1A and IGBT 1B) are arranged where a first IGBT and a second IGBT are arranged to conduct a bidirectional forward current along a current path up to a current threshold, which threshold may be set to at least 100 A, or at least 200 A in some non-limiting embodiments. Each additional IGBT pair may be arranged as an additional semiconductor die pair, as suggested in FIG. 3, where each IGBT pair is set to conduct current up to a similar or same current limit. Thus, in some non-limiting examples, a set of two IGBT pairs may form a switch die assembly wherein each IGBT pair conducts up to 200 A, or up to 400 A in total, a set of three IGBT pairs may each conduct up to 200 A, or up to 600 A in total, and so forth.

According to various embodiments of the disclosure, a protection circuit such as protection circuit 110, may include a programmable component, in order to set current thresholds, for example. In one instance, the logic circuit 112 may include a programmable circuit that may be set by a manufacturer according to a given application, or may be user-programmable.

Figure 4A:
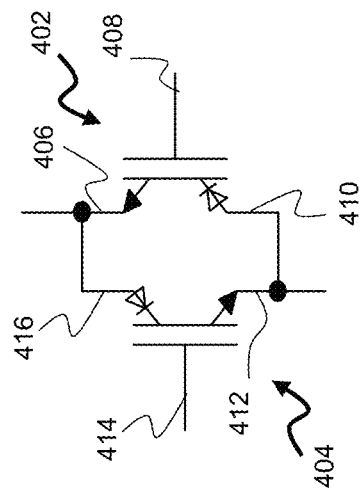
FIG. 4A shows a circuit representation of one embodiment of the bidirectional switch of FIG. 1, formed from two IGBTs with reverse blocking capabilities.

Turning now to FIG. 4A, there is shown a circuit representation of one embodiment of the bidirectional switch 104. As shown, the circuit arrangement is formed of a pair of IGBTs in a reverse blocking IGBT configuration, where a first IGBT and a second IGBT, are coupled to one another via a pair of emitter-to-collector connections. As such, in FIG. 4A, each IGBT is shown as inherently forming a mini-diode. In particular, the first IGBT 402 has a first emitter terminal 406, first gate terminal 408, and first collector terminal 410, while the second IGBT 404 has a second emitter terminal 412, second gate terminal 414, and second collector terminal 416. As shown, the first collector terminal 410 is electrically connected to the second emitter terminal 412, while the first emitter terminal 406 is electrically connected to the second collector terminal 416.

Figure 4C:
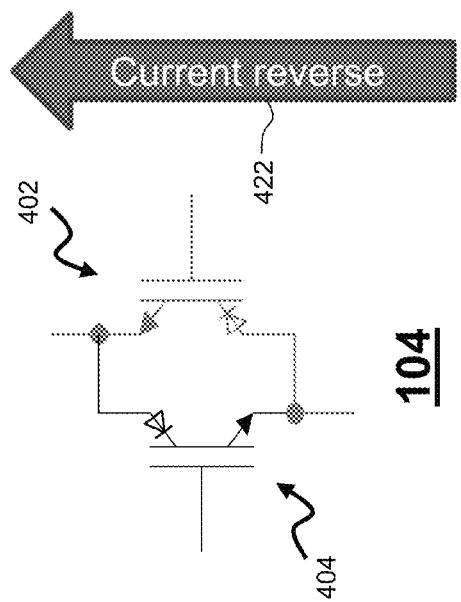
FIG. 4C shows a second scenario of operating the embodiment of the bidirectional switch of FIG. 4A.
Figure 4B:
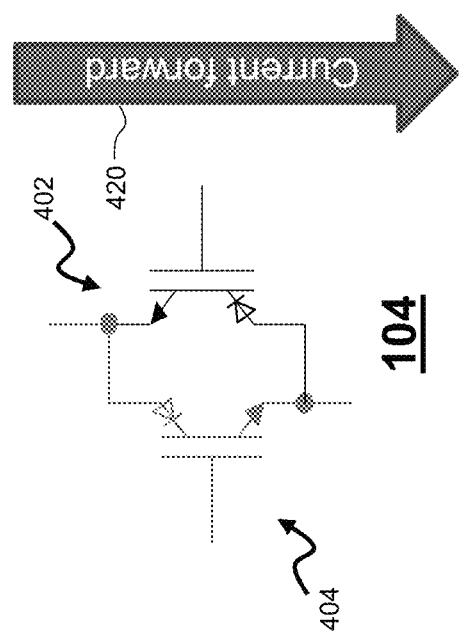
FIG. 4B shows a first scenario of operating the embodiment of the bidirectional switch of FIG. 4A.

Turning to FIG. 4B there is shown a first scenario of operating the embodiment of the bidirectional switch 104 of FIG. 4A, where a forward current 420 is passed through the bidirectional switch 104. Turning to FIG. 4C there is shown a second scenario of operating the embodiment of the bidirectional switch 104 of FIG. 4A, where a reverse current 422 is passed through the bidirectional switch 104. In each scenario, losses may take place in just one IGBT of the bidirectional switch.

According to various embodiments of the disclosure, during a fault condition, where the logic circuit 112 receives a current sense signal from the current sense circuit 108, this current sense signal may be supplied to a gate terminal of the bidirectional switch 104, to disconnect current conduction through the given IGBT.

In particular, during operation, the gates of the two IGBTs are supplied with a sufficient voltage to keep each IGBT in a turned-on condition. While in principle, during a fault, sending a signal to turn off the IGBT that carries the current is sufficient, for safety reasons, both IGBTs may be turned off during a fault.

Note that according to existing technology, a bidirectional protection circuit that conducts current normally in two directions may be provided by using a pair of sub-circuits where each sub-circuit is a combination-IGBT-and-diode. The respective IGBTs from each sub-circuit are arranged in electrical series to one another in a common-emitter configuration, and the anodes of the respective diodes are directly electrically coupled to one another. However, in the existing technology, four semiconductor dies may be required to implement this circuit. Notably, relatively speaking, the losses generated by the configuration of the embodiment of FIG. 4A may be 60%, while the losses generated by the pair of combination IGBT-diode circuit of the existing technology are 100%.

FIG. 5 presents an exemplary process flow 500. At block 502, a bidirectional switch is provided in an electrical system of a vehicle that is powered by a high voltage battery. Non-limiting examples of high voltage batteries include batteries providing voltage of 400 V or greater, such as 400 v-1000 V. The bidirectional switch may be formed of n pairs of IGBTs, where a given IGBT pair is arranged with a first IGBT and a second IGBT, electrically coupled to the first IGBT via a pair of emitter-to-collector connections.

At block 504, forward current or reverse current is conducted through the bidirectional switch and vehicle electrical system, where maximum current may be limited to a predetermined level, such as 500 A, 700 A, 1000 A. For example, the bidirectional switch may be programmable to have a trip-level current not to be exceeded, and in some embodiments may be programmable to limit the current slope during turn-off.

At block 506, an overcurrent condition is detected in the vehicle. For example, a current sense circuit may be provided in the vehicle to measure a fault current between a motor and the vehicle internal electrical system. The current sense circuit may be set to determine an overcurrent condition exists when current exceeds the predetermined limit. A current sense circuit may be based upon any suitable arrangement including shunt and Hall sensor circuitry.

At block 508, a signal is sent to the bidirectional switch, based upon the determined overcurrent condition, in order to block current transmission. For example, a logic circuit may be provided that is coupled to the current sense circuit and to the bidirectional switch, where the logic circuit includes a gate driver circuit, coupled to the gates of the bidirectional switch, to open or close these gates.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A bidirectional protection circuit, comprising:
a first reverse-blocking insulating gate bipolar transistor (IGBT), having a first gate terminal, a first collector terminal and a first emitter terminal;
a second reverse-blocking IGBT, having a second gate terminal, a second collector terminal, electrically coupled to the first emitter terminal, and a second emitter terminal, electrically coupled to the first collector terminal, wherein the first reverse-blocking IGBT and the second reverse-blocking IGBT define a first bidirectional current path; and
a switch control circuit, coupled to send a control signal to at least one of: the first gate terminal and the second gate terminal, during an overcurrent event,
wherein the first reverse-blocking IGBT and the second reverse-blocking IGBT are arranged within a first pair of semiconductor die, and arranged to conduct a bidirectional forward current along the first bidirectional current path up to a current threshold of at least 200 A.

2. The bidirectional protection circuit of claim 1, wherein the first reverse-blocking IGBT and the second reverse-blocking IGBT form a bidirectional switch, wherein the bidirectional switch is arranged in electrical series between a high voltage battery, generating a voltage of greater than 100 V, and a vehicle internal electrical system.

3. The bidirectional protection circuit of claim 2, wherein the switch control circuit comprises a current sense circuit, coupled to measure a fault current between a motor and the vehicle internal electrical system.

4. The bidirectional protection circuit of claim 1, wherein the switch control circuit comprises a logic circuit, including at least a gate driver circuit, coupled to the first gate and the second gate.

5. The bidirectional protection circuit of claim 1, further comprising;
a second pair of semiconductor die, comprising:
a third reverse-blocking IGBT having a third gate terminal, third collector terminal and a third emitter terminal; and
a fourth reverse-blocking IGBT, having a fourth gate terminal, a fourth collector terminal, electrically coupled to the third emitter terminal, and a fourth emitter terminal, electrically coupled to the third collector terminal, wherein the third reverse-blocking IGBT and the second reverse-blocking IGBT define a second bidirectional current path, electrically in parallel to the first current path.

6. The bidirectional protection circuit of claim 5, the second pair of semiconductor die being arranged to conduct a second bidirectional forward current along the second bidirectional current path up to a current threshold of at least 200 A, wherein the first semiconductor die pair and the second semiconductor die pair define a switch die assembly, arranged to conduct a bidirectional forward current along the second current path up to a current threshold of at least 400 A.

7. The bidirectional protection circuit of claim 1, further comprising:
one or more additional pairs of semiconductor die, the one or more additional semiconductor die pairs each comprising a pair of IGBTs,
wherein each of the one or more additional pairs of semiconductor die are arranged electrically in parallel to the first semiconductor die pair, and
wherein each of the one or more additional pairs of semiconductor die are arranged to conduct a respective bidirectional forward current along a respective current path up to a current threshold of at least 200 A.

8. An electrical protection circuit for a vehicle, comprising:
a bidirectional switch, comprising a first reverse-blocking IGBT and a second reverse-blocking IGBT, electrically coupled to the first reverse-blocking IGBT via a pair of emitter-to-collector connections;
a current sense circuit, coupled to measure an internal current in an internal electrical system of the vehicle; and
a logic circuit, coupled to receive a signal from the current sense circuit, and further including at least a gate driver circuit, coupled to a first gate of the first reverse-blocking IGBT and a second gate of the second reverse-blocking IGBT, wherein the first reverse-blocking IGBT and the second reverse-blocking IGBT are arranged within a first pair of semiconductor die, and arranged to conduct a bidirectional forward current along a first bidirectional current path up to a current threshold of at least 200 A.

9. The electrical protection circuit of claim 8, wherein the bidirectional switch is arranged in electrical series between a high voltage battery, generating a voltage of greater than 100 V, and the internal electrical system of the vehicle.

10. The electrical protection circuit of claim 8, wherein the current sense circuit and the logic circuit form a switch control circuit.

11. The electrical protection circuit of claim 8, further comprising;
a second pair of semiconductor die, comprising:
a third reverse-blocking IGBT having a third gate terminal, third collector terminal and a third emitter terminal; and
a fourth reverse-blocking IGBT, having a fourth gate terminal, a fourth collector terminal, electrically coupled to the third emitter terminal, and a fourth emitter terminal, electrically coupled to the third collector terminal, wherein the third reverse-blocking IGBT and the second reverse-blocking IGBT define a second bidirectional current path, electrically in parallel to the first bidirectional current path.

12. The electrical protection circuit of claim 11, the second pair of semiconductor die being arranged to conduct a bidirectional forward current along the second bidirectional current path up to a current threshold of at least 200

A, wherein the first pair of semiconductor die and the second pair of semiconductor die define a switch die assembly, arranged to conduct a bidirectional forward current along the first bidirectional current path and along the second bidirectional current path up to a total current threshold of at least 400 A.

13. A method of protecting an electrical system, comprising:
when a current level of an electrical current through the electrical system is below a trip level, conducting a forward current and a reverse current through a bidirectional switch;
determining a presence of an overcurrent condition when the trip level is reached; and
sending a signal to block current transmission through the electrical system when the overcurrent condition is present,
wherein the bidirectional switch comprises n pairs of IGBTs, where a given pair of IGBTs comprises a first reverse-blocking IGBT and a second reverse-blocking IGBT electrically coupled to the first reverse-blocking IGBT via a pair of emitter-to-collector connections,
wherein the first reverse-blocking IGBT and the second reverse-blocking IGBT are arranged within a first pair of semiconductor die, and arranged to conduct a bidirectional forward current along the first bidirectional current path up to a current threshold of at least 200 A.

14. The method of claim 13, wherein the electrical system is located in a vehicle, powered by a high voltage battery.

15. The method of claim 13, wherein the bidirectional switch is programmable to a current slope during turn-off of the electrical current.

16. The method of claim 13, wherein the over current condition is determined by a current sense circuit arranged to measure a fault current between a motor and the electrical system.

17. The method of claim 13, wherein the signal is sent from a gate driver circuit, coupled to a pair of gates of the bidirectional switch.

* * * * *